United States Patent [19]

Boulzaguet et al.

[11] Patent Number: 5,218,317
[45] Date of Patent: Jun. 8, 1993

[54] CHARGED-COUPLED DEVICE FOR HIGH-POWER TRANSMITTERS

[75] Inventors: Guy Boulzaguet, Nanterre; Guy-Arnaud Penet, Argenteuil both of France

[73] Assignee: Thomson-CSF, Puteaux, France

[21] Appl. No.: 802,400

[22] Filed: Dec. 4, 1991

[30] Foreign Application Priority Data

Dec. 27, 1990 [FR] France .................. 90 16332

[51] Int. Cl.$^5$ .................................. H03F 3/68
[52] U.S. Cl. ........................ 330/124 R; 330/124 D
[58] Field of Search .............. 330/84, 124 D, 124 R, 330/126, 295, 302; 455/103, 105

[56] References Cited

U.S. PATENT DOCUMENTS

| | | | |
|---|---|---|---|
| 3,345,578 | 10/1967 | Shuda | 330/124 D |
| 3,482,179 | 12/1969 | Webb | 330/286 X |
| 3,769,586 | 10/1973 | Shapiro et al. | 330/295 X |
| 4,468,626 | 8/1984 | Swanson | 330/295 X |

FOREIGN PATENT DOCUMENTS 0255652 2/1988 European Pat. Off. .

Primary Examiner—Steven Mottola
Attorney, Agent, or Firm—Oblon, Spivak, McClelland, Maier & Neustadt

[57] ABSTRACT

A transmitter which includes N amplifiers connected together by a common signal input and which output to a common load. The transmitter also includes N identical series LC circuits, each connected between an amplifier output and the common load, with the common points between each inductance and capacitance connected together. The extremely modular nature of the device makes the transmitter easy to reconfigure if one of the amplifiers fails.

3 Claims, 1 Drawing Sheet

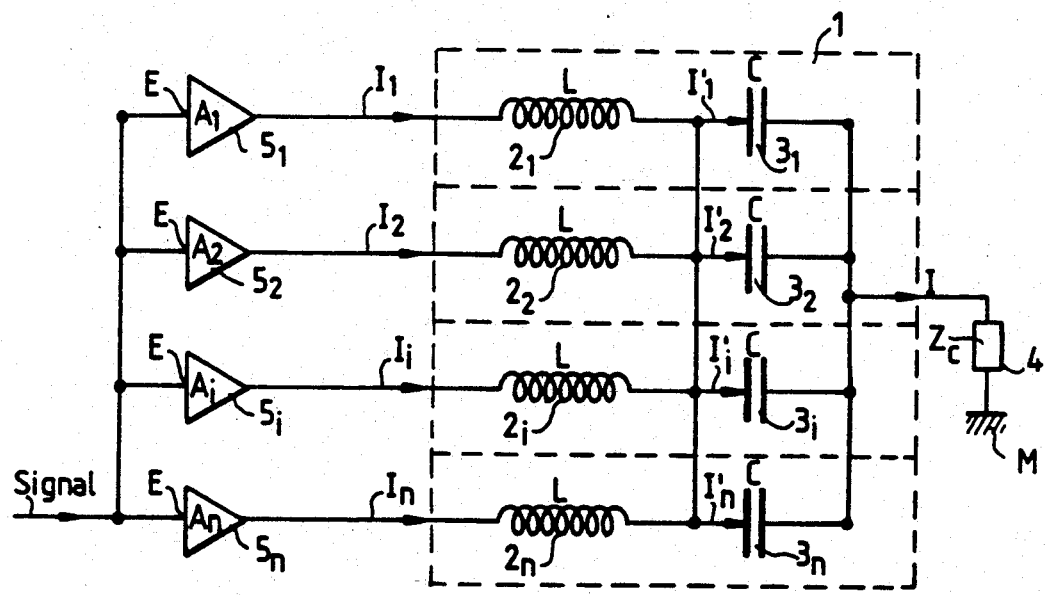

CHARGED-COUPLED DEVICE FOR HIGH-POWER TRANSMITTERS

BACKGROUND

This invention is a charged-coupled device for high-power transmitters.

It applies particularly to high-power, for example more than 100 KW, transitorized radio or acoustic transmitters operating in frequency bands between 5 KHz and 2 MHz.

To increase the output power from these transmitters, it is a known practice to connect a certain number of amplifiers in parallel, coupling them either directly or by a hybrid transformer or again by a bridge circuit.

However, none of these coupling methods makes it possible to obtain a transmitter which combines high energy efficiency, sufficient modularity and high output impedance outside the useful bandwidth and which decouples voltage sources applied to the amplifiers.

SUMMARY

This invention aims to overcome the above disadvantages.

The invention is, therefore, a charged-coupled device for high-power transmitters which consists of a given number N of amplifiers coupled by a common signal input which includes, firstly, a given number N of identical inductors, where N is the number of amplifiers, connected at one end to an amplifier output and at the second end to a common line and in which, secondly, at least one capacitor is connected between the common line and a transmitter load impedance.

BRIEF DESCRIPTION OF THE DRAWINGS

The invention will be better understood and other advantages will become clear upon reading the following description which refers to the single appended FIGURE, which is itself a non-exhaustive example of an embodiment of a charge-coupled device complying with the invention.

DETAILED DESCRIPTION

The coupling device is shown inside the dotted line 1 on the single appended drawing. This device consists of a given number N of inductors $2_1 \ldots 2_N$ connected together at one of their ends by a line common to N capacitors $3_1$ to $3_N$ connected in parallel. The second ends of the N capacitors $3_1$ to $3_N$ are also connected together and to an earth circuit M, which acts as a voltage common for the complete coupling device, via a load impedance 4 of value Zc. The free ends of the N inductors $2_1 \ldots 2_N$ are connected to the outputs of N transistorized amplifiers $5_1$ to $5_N$, the amplifiers having a common signal input E.

If $V_i$ and $I_i$ are the voltage and current output by an amplifier $5_i$, L and C the inductance and capacitance values of an inductor $2_i$ and a capacitor $3_i$, $I'_i$ is the current through a capacitor $3_i$ and I is the current through the load impedance 4, the voltage $V_i$ output by amplifier $5_i$ is given by $$V_i = jL\omega I_i - j/c\omega I'_i + Z_c I. \tag{1}$$

If the values of all the inductors and capacitors are identical and we add all voltages $V_i$ output by each of amplifiers $5_1$ to $5_N$ and if we introduce the fact that current I through load 4 is the sum of currents $I_1$ to $I_N$, the sum $\Sigma V_i$ can be written $$\Sigma V_i = (j/c\omega)(LC\omega^2 - 1)I + nZ_c I \tag{2}$$

At a transmitter operating frequency f at which the term $LC\omega^2 - 1$, where $\omega = 2\pi f$, is equal to zero, the current I through load 4 is given by the equation $$I = \frac{\Sigma V_i}{N \cdot Z_c} \tag{3}*$$

If the load impedance Z is purely resistive and equal to R and if the term $L\omega/R$ is made equal to 1, the current $I_i$ through each inductor $2_i$ is given by:

$$I_i = \frac{jV_i}{R} + \frac{SV_i(1+j)}{NR}$$

and an argument $\phi_i$ is given by $$\phi_i = \text{Arctan} \frac{(SV_i - N \cdot V_i)}{\Sigma V_i}$$

At equilibrium, when each amplifier outputs the same voltage $V_i = V_0$, the current I through load R becomes $I = nV_0/R$ and the current $I_i$ output by each amplifier becomes $I_i = V_0/R$.

However, if unbalance occurs such that, for example, the voltage output by one or several amplifiers $A_i$ becomes zero, a phase difference occurs between the voltage and the current applied to load 4, given by Arctan $(a/N - a)$ where a is the number of amplifiers that become open-circuit. It then becomes necessary to reconfigure the transmitter stages so that all amplifiers again produce a signal simultaneously. This reconfiguration can be done continuously using switches, not shown, to isolate the output from each defective amplifier from the transmitter load. Obviously, the coupling circuit described above could also be adapted in other ways, for example by using only one capacitor with a capacitance NC instead of N capacitors each with individual capacitance C, if compatible with the electrical characteristics of the transmitter.

What is claimed is:

1. A charge coupling device for a high-power transmitter consisting of a given number N of amplifiers coupled together by a common signal input and including, firstly, a given number N of roughly identical inductors where N is equal to the number of amplifiers, with one end of each inductor connected to a respective amplifier output and a second end of each inductor connected to a common line and, secondly, N capacitors of equal capacitance C connected in parallel with each other between the common line and one end of a transmitter load impedance.

2. A charge coupling device according to claim 1, wherein each capacitor and inductor forms a tuning circuit tuned at a working frequency of the transmitter.

3. A charge coupling device according to claim 1, wherein the N capacitances are formed by a single capacitor of capacitance NC.

* * * * *